(12) United States Patent
Inaoka et al.

(10) Patent No.: US 10,079,161 B2
(45) Date of Patent: Sep. 18, 2018

(54) METHOD FOR PRODUCING A SEMICONDUCTOR PACKAGE

(71) Applicant: J-Devices Corporation, Usuki-shi, Oita (JP)

(72) Inventors: Toshiyuki Inaoka, Nomi (JP); Yuichiro Yoshikawa, Nomi (JP); Atsuhiro Uratsuji, Nomi (JP); Katsushi Yoshimitsu, Nomi (JP)

(73) Assignee: J-DEVICES CORPORATION, Usuki-shi, Oita (JP)

( * ) Notice: Subject to any disclaimer, the term of this patent is extended or adjusted under 35 U.S.C. 154(b) by 0 days.

(21) Appl. No.: 15/884,979

(22) Filed: Jan. 31, 2018

(65) Prior Publication Data

US 2018/0174975 A1    Jun. 21, 2018

Related U.S. Application Data

(62) Division of application No. 15/585,659, filed on May 3, 2017, now abandoned.

(30) Foreign Application Priority Data

Jun. 28, 2016    (JP) ................. 2016-127753

(51) Int. Cl.
| | |
|---|---|
| *H01L 21/48* | (2006.01) |
| *H01L 23/00* | (2006.01) |
| *H01L 23/538* | (2006.01) |
| *H01L 21/56* | (2006.01) |
| *H01L 23/367* | (2006.01) |

(52) U.S. Cl.
CPC ........ *H01L 21/4871* (2013.01); *H01L 21/561* (2013.01); *H01L 23/3675* (2013.01); *H01L 23/5389* (2013.01); *H01L 24/24* (2013.01); *H01L 2224/24137* (2013.01); *H01L 2924/15747* (2013.01)

(58) Field of Classification Search
CPC ... H01L 23/5389; H01L 21/561; H01L 24/24; H01L 2224/24137; H01L 23/3675; H01L 21/52
See application file for complete search history.

(56) References Cited

U.S. PATENT DOCUMENTS

| | | |
|---|---|---|
| 7,011,988 B2 | 3/2006 | Forcier |
| 7,759,777 B2 | 7/2010 | Otremba et al. |
| 7,851,263 B2 | 12/2010 | Fuchinoue |
| 7,863,096 B2 | 1/2011 | England |
| 7,989,270 B2 | 8/2011 | Huang et al. |

(Continued)

FOREIGN PATENT DOCUMENTS

JP    2010-219489 A    9/2010

*Primary Examiner* — Scott B Geyer
(74) *Attorney, Agent, or Firm* — Flynn Thiel, P.C.

(57) ABSTRACT

An object of the present invention is to provide a semiconductor package with which it is possible to reduce a volume of an encapsulation resin and to easily embed a resin regardless of thicknesses of semiconductor chips and a small distance between adjacent semiconductor chips, as well as to provide a thin semiconductor package with which a final product includes no support flat plate. To realize this, a semiconductor package having a structure wherein semiconductor chips are accommodated in cavity parts of a support which is formed by copper plating and includes the cavity parts is provided.

5 Claims, 7 Drawing Sheets

(56) References Cited

U.S. PATENT DOCUMENTS

| | | | |
|---|---|---|---|
| 8,597,979 B1 * | 12/2013 | Burgyan | H01L 23/3121 257/686 |
| 2007/0178279 A1 | 8/2007 | Ogawa et al. | |
| 2010/0044842 A1 | 2/2010 | Mengel et al. | |
| 2010/0144101 A1 | 6/2010 | Chow et al. | |
| 2010/0213599 A1 | 8/2010 | Watanabe et al. | |
| 2011/0014747 A1 * | 1/2011 | Lam | H01L 21/561 438/107 |
| 2013/0010441 A1 | 1/2013 | Oganesian et al. | |
| 2013/0127031 A1 | 5/2013 | Hosseini et al. | |
| 2013/0344631 A1 | 12/2013 | Matoba et al. | |
| 2014/0035114 A1 | 2/2014 | Gogoi et al. | |
| 2015/0235935 A1 | 8/2015 | Lin et al. | |
| 2015/0262928 A1 | 9/2015 | Shen et al. | |
| 2016/0111395 A1 | 4/2016 | Heinrich | |
| 2016/0240452 A1 | 8/2016 | Prajuckamol et al. | |

\* cited by examiner

METHOD FOR PRODUCING A SEMICONDUCTOR PACKAGE

This is a divisional of prior U.S. application Ser. No. 15/585,659, filed May 3, 2017.

BACKGROUND OF THE INVENTION

1. Field of the Invention

The present invention relates to a semiconductor package and a method for producing the same. In particular, the present invention relates to a semiconductor package having a Panel Level Package (hereinafter referred to as PLP) structure involving a thin-film wiring step and an assembly step in a large panel scale, and relates to a method for producing the same.

2. Description of the Related Art

With a recent demand for highly functional, compact electronic equipment, high density integration and, moreover, high-density packaging of electronic parts have made progress. Accordingly, a semiconductor device used in such electronic equipment has been reduced in size to a greater degree than ever before.

Japanese Patent Publication No. 2010-219489 describes an example of a method for producing a semiconductor package aiming at increasing the density of electronic parts and enhancing compactness thereof.

Figure 4:
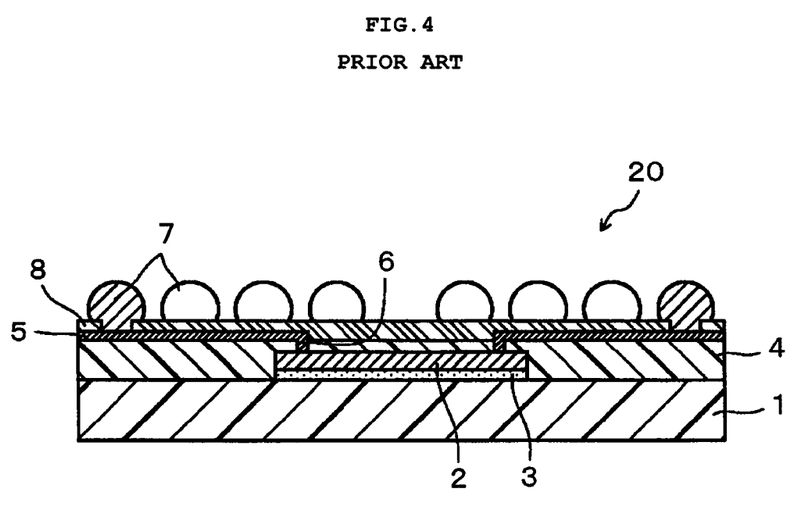
FIG. 4 is a drawing of a structure of a conventional PLP.

The basic structure of the semiconductor device described in Japanese Patent Publication No. 2010-219489 is shown in FIG. 4, and the semiconductor device is described below.

A semiconductor device 20 includes a support plate 1 formed of a cured resin or a metal. A semiconductor chip 2 is disposed on one main face of the support plate 1 such that an element circuit surface (front side surface) of the semiconductor chip 2 faces upward, and the surface (back side surface) opposite to the element circuit surface is fixed on the support plate 1 with an adhesive 3. An insulating material layer 4 is formed singly on the entire main face of the support plate 1, covering the element circuit surface of the semiconductor chip 2. Wiring layers 5 comprising a conductive metal such as copper are formed on this single insulating material layer 4 and are partially extended to peripheral regions of the semiconductor chip 2. A conductive part (via part) 6 that electrically connects an electrode pad of the semiconductor chip 2 and the wiring layers 5 is formed in the insulating material layer 4 formed on the element circuit surface of the semiconductor chip 2. This conductive part 6 and the wiring layers 5 are collectively formed and are integrated. A plurality of solder balls 7 that are external electrodes are formed on predetermined positions of the wiring layers 5. Wiring protection layers (solder resist layers) 8 are further formed on the insulating material layer 4 and the wiring layers 5 excluding parts joined to the solder balls 7.

A method for producing a conventional PLP is described with reference to FIGS. 5A to 5C.

Figure 5A:
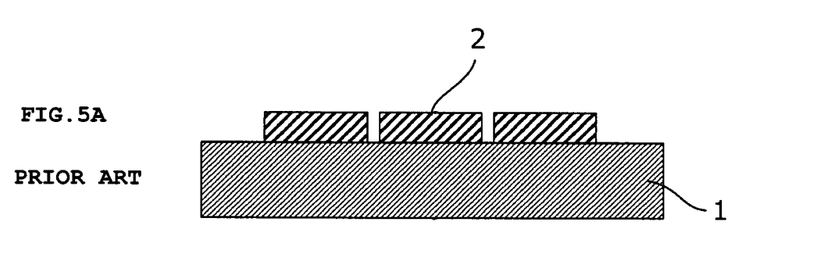
FIG. 5A to 5C are drawings showing an overview of the steps of producing a conventional PLP.
Figure 5B:
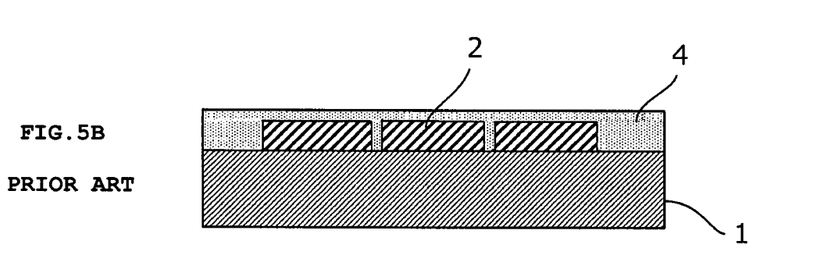
Figure 5C:
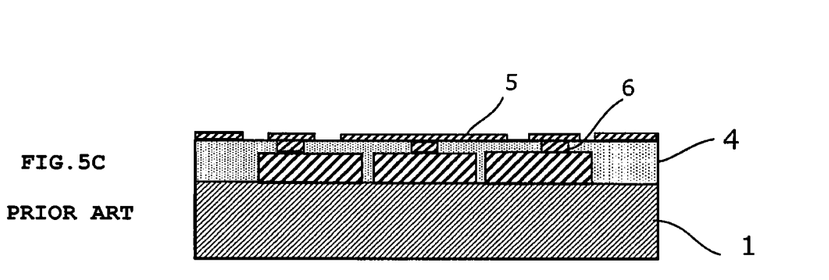

FIGS. 5A to 5C show an overview of a method for producing a package, in which a single package includes three semiconductor chips 2. Note that FIGS. 5A to C only show one package, while in actual practice a plurality of packages are assembled simultaneously on a large panel.

The method for producing a package includes steps (A), (B), and (C).

(A) A step of mounting semiconductor chips (see FIG. 5A)

Semiconductor chips 2 are fixed, with an adhesive, on one main face of a support plate 1 formed of a cured resin, stainless steel, or a metal such as a 42 alloy, with the element circuit surface facing upward.

(B) A step of encapsulating (see FIG. 5B)

The face of the support plate 1, on which the semiconductor chips 2 are mounted, is encapsulated with an insulating material layer 4.

(C) A step of forming wiring layers (see FIG. 5C)

Wiring layers 5 via-connected to electrodes of the semiconductor chips 2, through via conductors 6, are formed.

SUMMARY OF THE INVENTION

Problems to be Solved by the Invention

In the conventional PLP shown in FIG. 4, a final product includes a support plate 1. Thus, an increase in mounting rate of semiconductor chips 2 results in warping of a panel during production and interference of the semiconductor chips 2 with a device for producing an PLP.

An increase in thicknesses of the semiconductor chips 2 and a decrease in distance between the adjacent semiconductor chips 2 result in an insulating resin being unable to enter a space therebetween. If the thickness of a resin material is increased to solve this problem, the thickness of the semiconductor package itself cannot be reduced.

An increase in thicknesses of the semiconductor chips causes an increase in distance between the support plate 1 and each wiring layer 5. Thus, it becomes difficult to perform boring of a via by laser and connection by copper plating for connecting the support plate 1 and each wiring layer 5.

An object of the present invention is to provide a semiconductor package with which it is possible to reduce a volume of an encapsulation resin and to easily embed a resin regardless of thicknesses of semiconductor chips and a small distance between adjacent semiconductor chips, as well as to provide a thin semiconductor package with which a final product includes no support flat plate.

The inventors of the present invention found that these problems can be solved by a structure in which semiconductor chips are embedded in the respective cavity parts formed by copper plating and completed the present invention.

That is, the present invention relates to a semiconductor package and a method for producing the same as described below.

(1) A semiconductor package having a structure wherein semiconductor chips are accommodated in cavity parts of a support which is formed by copper plating and includes the cavity parts.

(2) The semiconductor package according to the item (1) above, wherein each cavity part has a height lower than each semiconductor chip to avoid interference between a semiconductor chip arrangement jig and cavity walls that form the cavity parts.

(3) The semiconductor package according to the item (1) above, wherein each cavity wall that is an outer peripheral part of the semiconductor package includes a step extended toward an upper part, and the step has a height lower than each semiconductor chip to avoid interference between the semiconductor chip arrangement jig and the cavity walls.

(4) A semiconductor package including:

a support;

semiconductor chips arranged on one surface of the support via an adhesive layer, with element circuit surfaces of the semiconductor chips facing upward;

an insulating material layer that encapsulates the semiconductor chips and the periphery thereof;

in the insulating material layer, openings formed on electrodes that are placed on the element circuit surfaces of the semiconductor chips;

conductive parts formed in the openings to connect with the electrodes of the semiconductor chips;

wiring layers formed on the insulating material layer to connect with the conductive parts and partially extended to peripheral regions of the semiconductor chips; and external electrodes formed on the wiring layers, wherein the support is formed by a copper plated object having cavity parts that accept the semiconductor chips on the one surface, the semiconductor chips being accommodated in the respective cavity parts, and the insulating material layer is on the other surface of the support.

(5) A method for producing a semiconductor package, including, in the following order, the steps of:

laying a copper foil on one main face of a support flat plate;

performing electroplating to form a copper plating layer on the copper foil;

performing electroplating to form cavity parts on the copper plating layer;

fixing surfaces opposite to element circuit surfaces of the semiconductor chips in the cavity parts with an adhesive;

resin-encapsulating the semiconductor chips with an insulating resin to form an encapsulation resin layer;

forming openings in the insulating material layer upon positions corresponding to electrodes arranged on the element circuit surfaces of the semiconductor chips;

forming, on the insulating material layer, wiring layers partially extended to peripheral regions of the semiconductor chips, and forming, in the openings of the insulating material layer, conductive parts connected to the electrodes of the semiconductor chips;

forming a solder resist on the wiring layer except in portions corresponding to the openings;

forming external electrodes on parts of the wiring layer corresponding to the openings;

separating the support flat plate from the copper foil; and forming an insulating material layer on the copper foil after separation.

(6) A method for producing a semiconductor package having a support flat plate, including, in the following order, the steps of:

laying a copper foil on one main face of the support flat plate;

performing electroplating to form a copper plating layer on the copper foil;

performing electroplating to form cavity parts on the copper plating layer;

fixing surfaces opposite to element circuit surfaces of the semiconductor chips in the cavity parts with an adhesive;

resin-encapsulating the semiconductor chips with an insulating resin to form an encapsulation resin layer;

forming openings in the insulating material layer upon positions corresponding to electrodes arranged on the element circuit surfaces of the semiconductor chips;

forming, on the insulating material layer, wiring layers partially extended to peripheral regions of the semiconductor chips, and forming, in the openings of the insulating material layer, conductive parts connected to the electrodes of the semiconductor chips;

forming a solder resist on the wiring layer except in portions corresponding to the openings; and forming external electrodes on parts of the wiring layer corresponding to the openings.

(7) The method for producing a semiconductor package according to the item (5) or (6) above, wherein the cavity parts are formed by forming parts that are not copper-plated by pattern plating using a resist.

(8) A method for producing a semiconductor package, including, in the following order, the steps of:

laying a copper foil on each of both surfaces of a support flat plate;

performing electroplating to form a copper plating layer on the copper foil;

performing electroplating to form cavity parts on the copper plating layer;

fixing surfaces opposite to element circuit surfaces of the semiconductor chips in the cavity parts with an adhesive;

resin-encapsulating the semiconductor chips with an insulating resin to form an encapsulation resin layer;

forming openings in the insulating material layer upon positions corresponding to electrodes arranged on the element circuit surfaces of the semiconductor chips;

forming, on the insulating material layer, wiring layers partially extended to peripheral regions of the semiconductor chips, and forming, in the openings of the insulating material layer, conductive parts connected to the electrodes of the semiconductor chips;

forming a solder resist on the wiring layer except in portions corresponding to the openings;

forming external electrodes on parts of the wiring layer corresponding to the openings to form package parts on both surfaces of the support flat plate;

separating the support flat plate from the copper foils of the package parts to obtain two package parts; and forming an insulating material layer on the copper foils of the two package parts.

Advantageous Effects of Invention

Advantageous effects of the semiconductor package of the present invention include the following.

Cavity parts of a support that is formed by copper plating accommodate the respective semiconductor chips; as a result, a volume to be encapsulated using an encapsulation resin is made smaller, and the resin can be easily embedded regardless of thicknesses of semiconductor chips and a small distance between adjacent semiconductor chips.

A final product has a structure supported by a support formed by copper plating, thus ground connection with the support formed by copper plating is established through an ordinary via for interlayer connection, and the EMI shielding effect can be improved.

A final product of the semiconductor package can be configured to include no support flat plate. The semiconductor package thus can be thin and can be applied to a wide range of products such as mobile products.

DESCRIPTION OF THE PREFERRED EMBODIMENTS

Embodiments of the present invention are described below. Although the following description is made with reference to the drawings, these drawings are merely for the sake of illustration, and the present invention is by no means limited thereto.

The semiconductor package of the present invention has a structure in which semiconductor chips are accommodated in cavity parts of a support which is formed by copper plating and includes the cavity parts.

Embodiments of the semiconductor package having the structure are described below in detail with reference to the drawings.

First Embodiment

The present embodiment is described with reference to FIGS. 1-1, 1-2, and 1-3.

Figure 1A:
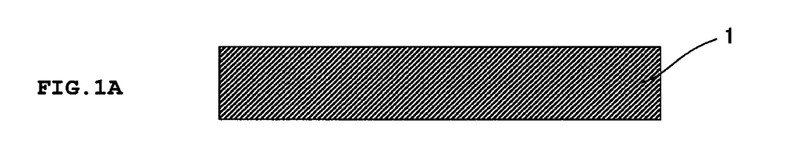
FIGS. 1A to 1D are drawings showing the steps of forming a support that is formed by copper plating, including cavity parts on a support flat plate.

FIG. 1A is a drawing of a support flat plate 1. The support flat plate 1 is a flat plate having a uniform thickness, and as the support flat plate 1, a cured resin obtained by curing an insulating resin or a metal having high rigidity such as SUS or a 42 alloy can be used. The support flat plate 1 imparts rigidity to a panel and serves to prevent warping in production steps. The support flat plate 1 is thus only required to have a thickness with which warping does not occur.

The support flat plate 1 remaining in a final product not only functions as a stiffener, a heat radiation plate, an electromagnetic shield, but also serves as a carrier for transferring a product in the production steps. Stainless steel is thus preferably used as the support flat plate 1 for the ease of handling of a panel, prevention of warping, and the ease of dividing.

Figure 1B:
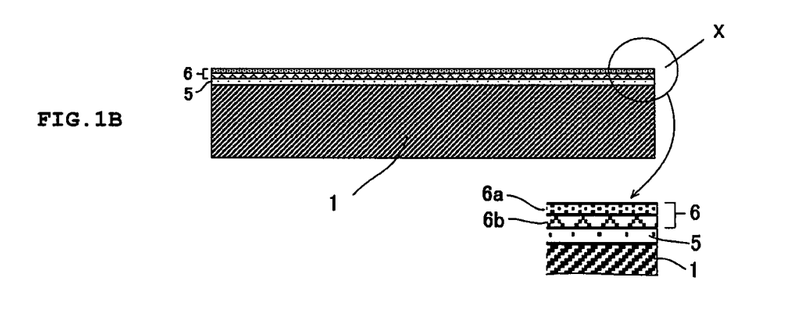

FIG. 1B is a drawing showing a state where a copper foil 6 is laid on the support flat plate 1 via an adhesive layer 5.

As shown in an enlarged view of a part X of FIG. 1B, the copper foil 6 is an ordinary copper foil with a carrier and has a two-layer structure of an ultrathin copper foil 6a and a copper foil carrier 6b.

The front and rear of the carrier surface can be changed during laying in accordance with usage, and when the support flat plate 1 is to be included in a final product, the copper foil carrier may be removed in this step.

The case where the support flat plate 1 is eventually removed from a product is described below.

Figure 1C:
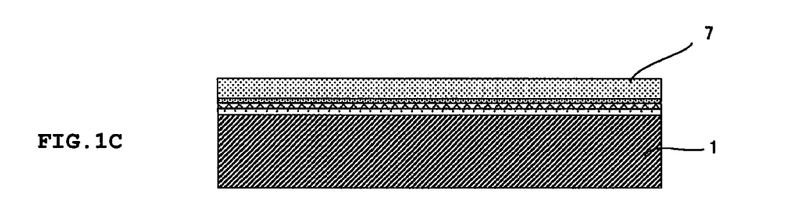

FIG. 1C is a drawing showing a state where a copper plating layer 7 is formed on the copper foil 6 by electrolytic copper plating to have an in-plane uniform thickness. The copper plating layer 7 is to be a surface on which semiconductor chips 9 are placed.

Figure 1D:
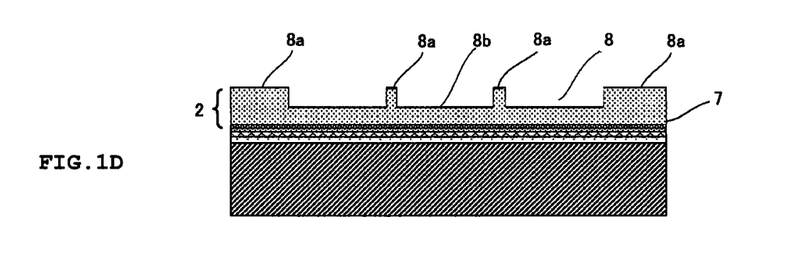

FIG. 1D is a drawing showing a state where cavity walls 8a are formed on the copper plating layer 7 using a process of forming wiring by ordinary electroplating to form a support 2 by copper plating. Each cavity part 8 of the support 2 that is formed by copper plating is formed of the cavity walls 8a that are formed by copper plating and a cavity bottom surface 8b that is a surface of the copper plating layer 7.

The process of forming wiring by ordinary electroplating is, for example, a process of laminating a photosensitive dry film resist on the copper plating layer 7, subjecting the photosensitive dry film resist to exposure to light and developing to perform patterning, forming, by electroplating, the cavity walls 8a that are formed by copper plating in an opening that is formed by the patterning, and removing the resist.

The cavity part 8 preferably has a height lower than the semiconductor chips 9. In the present invention, the height of the cavity part 8 is referred to as the height of the cavity.

Figure 1E:
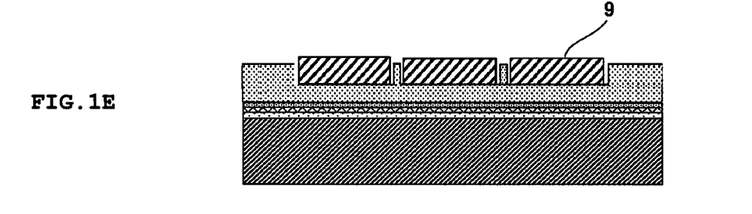
FIGS. 1E to 1H are drawings showing the steps of arranging semiconductor chips in the respective cavity parts of a support that is formed by copper plating, forming an encapsulation resin layer, and forming a wiring layer on the surface of the encapsulation resin layer.

FIG. 1E is a drawing showing a state where the semiconductor chips 9 are arranged in the respective cavity parts 8.

The semiconductor chips 9 are arranged by applying an adhesive to the back surfaces of the semiconductor chips 9 or the cavity bottom surfaces of the cavity parts 8, picking the semiconductor chips 9 up and fixing them on the cavity bottom surfaces 8b by a die-bonding device. At that time, when the heights of the cavity parts 8 are higher than the semiconductor chips 9, a semiconductor chip arrangement jig (e.g., collet) may be in contact with the cavity walls 8a. Each cavity part 8 thus preferably has a height equal to or lower than the semiconductor chips 9.

Figure 1F:
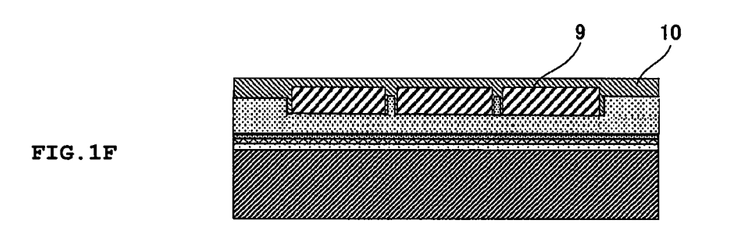

FIG. 1F is a drawing showing a state where an encapsulation resin layer 10 formed of an insulating resin that encapsulates the semiconductor chips 9 is formed.

For example, lamination, transfer molding, or compression molding can be used for the encapsulation.

Figure 1G:
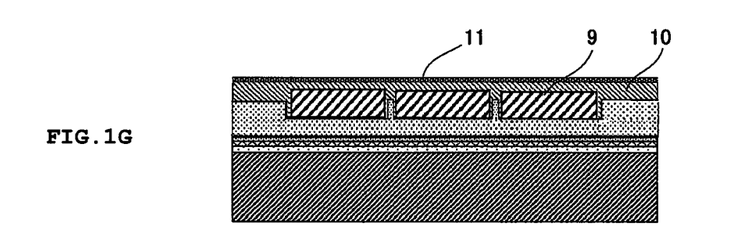

FIG. 1G is a drawing showing a state where a copper foil 11 is laid on the encapsulation resin layer 10.

The copper foil 11 is provided to form a wiring layer on the surface of the encapsulation resin layer 10. Meanwhile, as a substitute for providing the copper foil 11, a seed layer may be formed on the surface of the encapsulation resin layer 10 by, for example, electroless plating, sputtering, or PVD, and a copper plating film is then formed by electroplating.

Figure 1H:
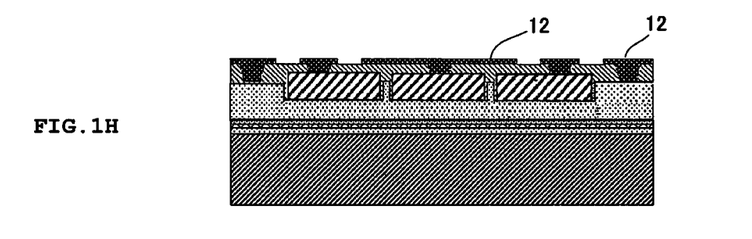

FIG. 1H is a drawing showing a state where a wiring layer 12 is formed on the surface of the encapsulation resin layer 10.

This wiring layer 12 can be formed by, for example, subjecting the copper foil 11 to a pretreatment such as blackening or etching if necessary, thereafter subjecting the copper foil 11 to, for example, a treatment for forming an opening by laser or a desmear treatment, and then subjecting to a process of forming wiring by ordinary electroplating.

Figure 1I:
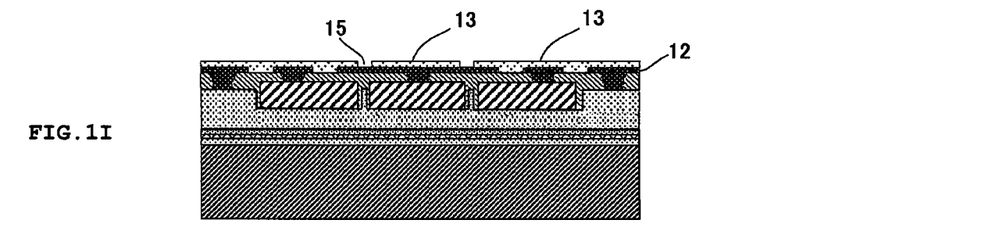
FIGS. 1I to 1L are drawings showing steps of forming a solder resist that has openings on the surface of a wiring layer, forming external electrodes in the openings of the solder resist, separating between a support flat plate and a semiconductor package, and forming an insulating layer on the back surface of the separated semiconductor package.

FIG. 1I is a drawing showing a state where a solder resist 13 is formed on the wiring layer 12.

Only wiring parts that are required to be soldered are caused to be exposed by forming openings 15, and parts that are not require to be soldered are coated with an insulating material such as a thermosetting epoxy resin to form a solder resist 13.

Figure 1J:
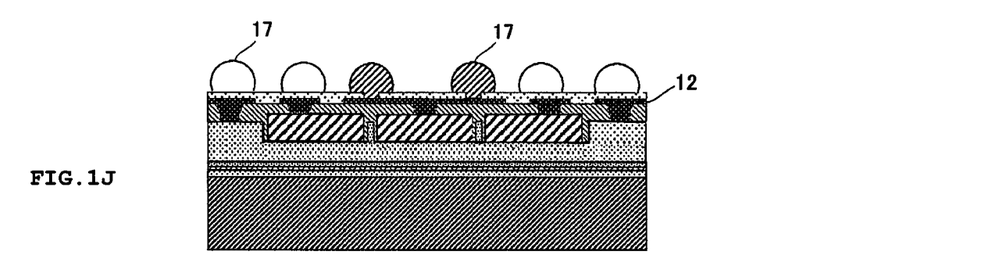

FIG. 1J is a drawing showing a state where solder balls 17 that are external electrodes are formed in the openings 15.

Figure 1K:
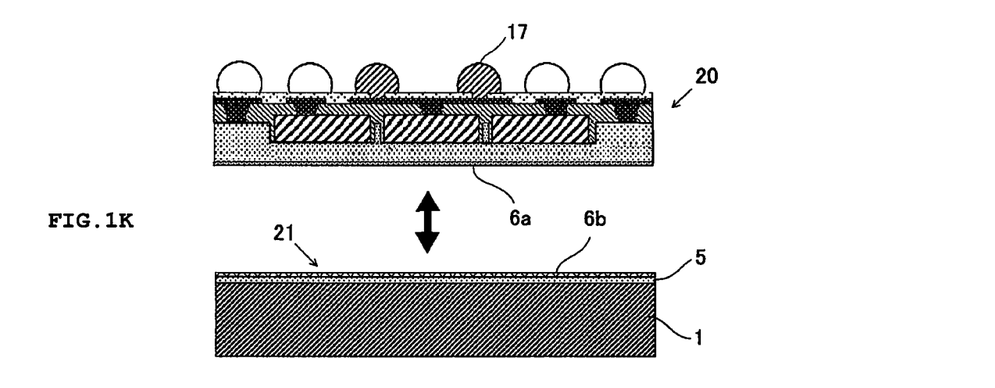

FIG. 1K is a drawing showing a state where a package part 20 and a support flat plate part 21 are separated from each other.

The semiconductor package according to the present embodiment as a final product has a structure of including no support flat plate. The package part 20 and the support flat plate part 21 are thus separated from each other. Specifically, incisions are made in edges of the material of the copper foil 6 from both ends of the solder resist 13 to separate between the ultrathin copper foil 6a and the copper foil carrier 6b.

The incisions are made by cutting the inside of the size of the material of the copper foil, considering cutting equipment and the accuracy of attaching the copper foil.

Figure 1L:
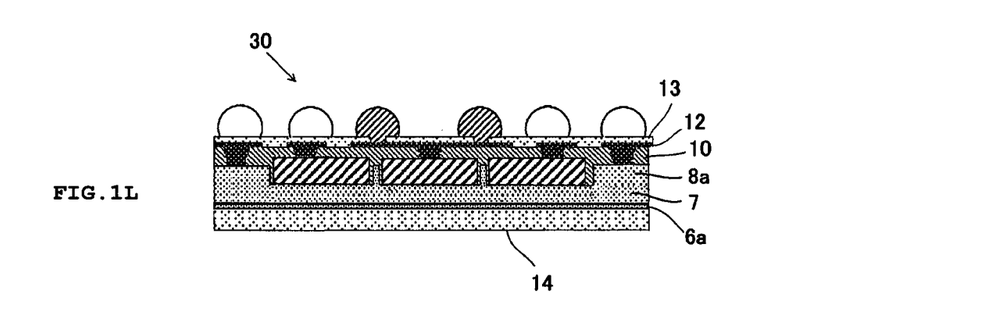

FIG. 1L is a drawing showing a state where a solder resist or an insulating material layer 14 is formed on the ultrathin copper foil 6a adhered to the copper plating layer 7 side of the package part 20 separated from the support flat plate part 21.

A semiconductor package 30 can be obtained by performing a surface treatment such as gold plating on the wiring layer 12 in the openings 15 and dividing, if necessary.

When the copper foil carrier 6b is removed in the step shown in FIG. 1B, that is, a final product including a support flat plate 1 is produced, a semiconductor package including a support flat plate can be obtained by performing a surface treatment such as gold plating on parts of the wiring layer 12 exposed by the openings 15 in an object in the state where a solder resist 13 is formed shown in FIG. 1I and dividing.

Second Embodiment

The present embodiment is described with reference to FIGS. 2A to 2C. The present embodiment is an application example of the first embodiment.

In the present embodiment, a copper foil 6 is laid via a resin 5 on each of the both surfaces of the support flat plate 1 in the object shown in FIG. 1B according to the first embodiment to obtain a support flat plate part 21.

Figure 2A:
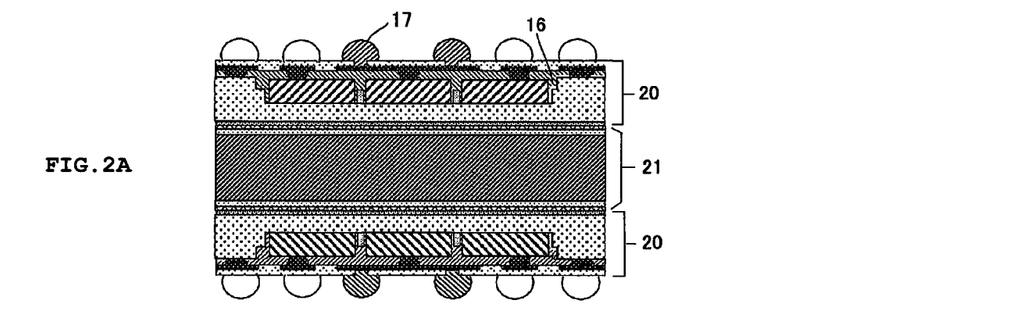
FIG. 2A is a drawing showing a state where semiconductor package parts are formed on both surfaces of a support flat plate.

FIG. 2A is a drawing showing a state where both surfaces of the support flat plate 1 is subjected to the same step as performed in the first embodiment to form package parts 20 and 20' on both surfaces of the support flat plate part 21.

The formation of the package parts 20 and 20' on both surfaces of the support flat plate part 21 requires a step of arranging and fixing the semiconductor chips 9 in the respective cavity parts 8 on one surface (front side surface) of the support flat plate part 21, and then arranging other semiconductor chips 9 in the respective cavity parts 8 on the other surface (back side surface) of the support flat plate part 21.

In this case, as described in the first embodiment, formation of cavity parts 16 having cavity walls 8a that have lower heights than the semiconductor chips 9 results in contact of the surfaces of the semiconductor chips 9 arranged on the front side surface in advance with a device table in the arrangement of the semiconductor chips 9 on the back side surface. This causes a reduction in a yield.

The cavities 16 having heights equal to or higher than the semiconductor chips 9 are thus formed in the present embodiment.

Figure 3:
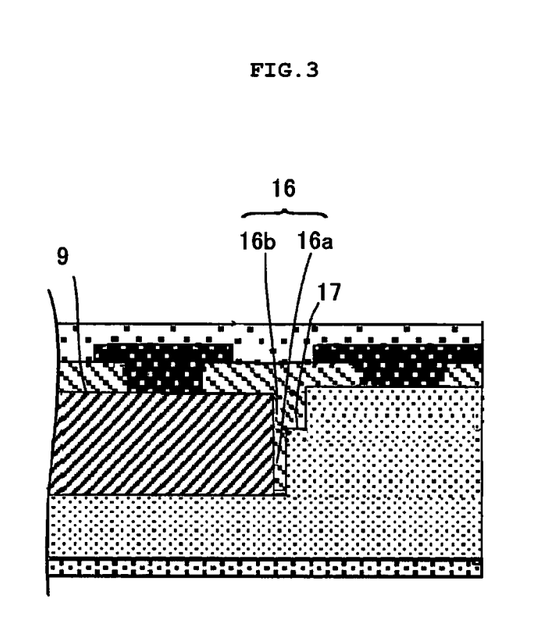
FIG. 3 is a partially enlarged view of one of the semiconductor packaging parts shown in FIG. 2A.

FIG. 3 is an enlarged view of a cavity part 16 in a package part shown in FIG. 2A.

Each cavity wall of each cavity part 16 has a step 17, and each cavity part 16 has a two-step structure of a cavity 16a having a smaller width and a cavity 16b having a larger width.

The heights of the cavity 16a are required to be heights with which a jig does not interfere with the cavity walls of the cavities 16b in the arrangement of the semiconductor chips. The sizes of the openings in the cavities 16b are required to be sizes with which a jig does not interfere with the cavity walls of the cavities 16b in the arrangement of the semiconductor chips.

Such cavity parts each having a two-step structure can be employed as the cavity parts in the first embodiment.

Figure 2B:
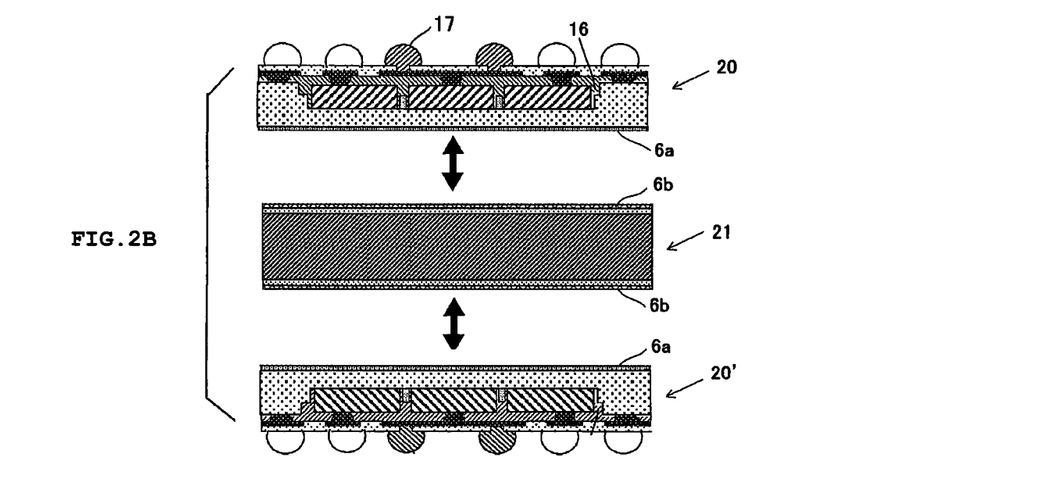
FIG. 2B is a drawing showing a state where the support flat plate is separated from the semiconductor package parts.

FIG. 2B is a drawing showing a state where the package parts 20 and 20' are separated from the support flat plate part 21.

Figure 2C:
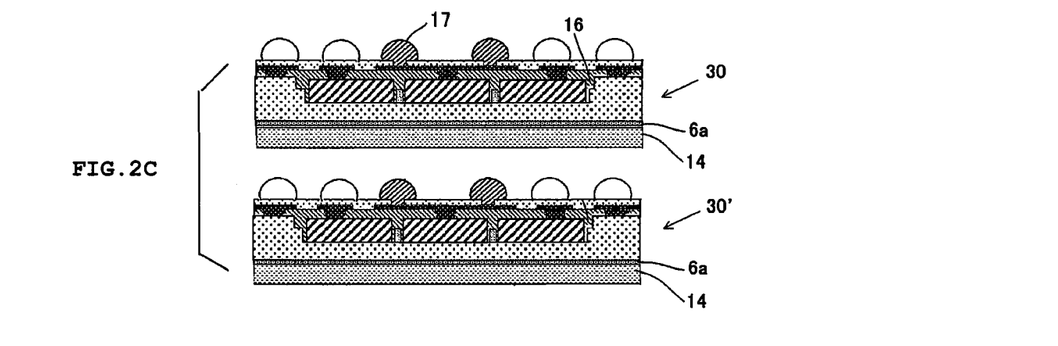
FIG. 2C is a drawing showing a state where insulating material layers are formed on one surfaces of semiconductor package parts.

FIG. 2C is a drawing showing a state where a solder resist or an insulating material layer 14 is formed on each ultrathin copper foil 6a adhered to each copper plating layer 7 of each of the package parts 20 and 20' separated from the support flat plate part 21.

Subsequently, a surface treatment such as gold plating is performed on parts of each wiring layer 12 in the openings 15 if necessary, and dividing is performed, to obtain semiconductor packages 30 and 30'.

Advantages of the semiconductor package of the present invention are as follows.

The final product of the semiconductor package can be configured to include no support flat plate. The semiconductor package thus can be thin and can be applied to a wide range of products such as mobile products.

The support flat plate can be removed from the final product. The warping of the panel in production thus can be prevented even when the semiconductor package is thin.

The semiconductor chips can be embedded in the respective cavity parts. Thus, the volume of the insulating resin to be embedded is reduced, and the resin can be easily embedded even when the semiconductor chips are thick, and the distance between adjacent semiconductor chips are small. Moreover, the variations in thickness of the resin on the semiconductor chips can be reduced, and electrical characteristics such as pass characteristics and characteristic impedance are excellent.

The cavity parts are formed by copper plating. Thus, unlike the etching, the accuracy of dimension in the depth direction is excellent.

A copper plated object is used as a support in the final product, thus ground connection is established with the copper-plated support plate through an ordinary via for interlayer connection, and the EMI shielding effect can be improved.

With a structure of having cavities, a distance between a support formed by copper plating and a wiring layer can be reduced even when the semiconductor chips are thick, facilitating laser boring of a via and connection by copper plating.

What is claimed is:
1. A method for producing a semiconductor package, including, in the following order, the steps of:
laying a copper foil on one main face of a support flat plate;
performing electroplating to form a copper plating layer on the copper foil;
performing electroplating to form cavity parts on the copper plating layer;

fixing surfaces opposite to element circuit surfaces of semiconductor chips in the cavity parts with an adhesive;
resin-encapsulating the semiconductor chips with an insulating resin to form an encapsulation resin layer;
forming openings in the insulating material layer upon positions corresponding to electrodes arranged on the element circuit surfaces of the semiconductor chips;
forming, on the insulating material layer, wiring layers partially extended to peripheral regions of the semiconductor chips, and forming, in the openings of the insulating material layer, conductive parts connected to the electrodes of the semiconductor chips;
forming a solder resist on the wiring layer except in portions corresponding to the openings;
forming external electrodes on parts of the wiring layer corresponding to the openings;
separating the support flat plate from the copper foil; and
forming an insulating material layer on the copper foil after separation.

2. The method for producing a semiconductor package according to claim 1, wherein
the cavity parts are formed by forming parts that are not copper-plated by pattern plating using a resist.

3. A method for producing a semiconductor package having a support flat plate, including, in the following order, the steps of:
laying a copper foil on one main face of the support flat plate;
performing electroplating to form a copper plating layer on the copper foil;
performing electroplating to form cavity parts on the copper plating layer;
fixing surfaces opposite to element circuit surfaces of semiconductor chips in the cavity parts with an adhesive;
resin-encapsulating the semiconductor chips with an insulating resin to form an encapsulation resin layer;
forming openings in the insulating material layer upon positions corresponding to electrodes arranged on the element circuit surfaces of the semiconductor chips;
forming, on the insulating material layer, wiring layers partially extended to peripheral regions of the semiconductor chips, and forming, in the openings of the insulating material layer, conductive parts connected to the electrodes of the semiconductor chips;
forming a solder resist on the wiring layer except in portions corresponding to the openings; and
forming external electrodes on parts of the wiring layer corresponding to the openings.

4. The method for producing a semiconductor package according to claim 3, wherein
the cavity parts are formed by forming parts that are not copper-plated by pattern plating using a resist.

5. A method for producing a semiconductor package, including, in the following order, the steps of:
laying a copper foil on each of both surfaces of a support flat plate;
performing electroplating to form a copper plating layer on the copper foil;
performing electroplating to form cavity parts on the copper plating layer;
fixing surfaces opposite to element circuit surfaces of semiconductor chips in the cavity parts with an adhesive;
resin-encapsulating the semiconductor chips with an insulating resin to form an encapsulation resin layer;
forming openings in the insulating material layer upon positions corresponding to electrodes arranged on the element circuit surfaces of the semiconductor chips;
forming, on the insulating material layer, wiring layers partially extended to peripheral regions of the semiconductor chips, and forming, in the openings of the insulating material layer, conductive parts connected to the electrodes of the semiconductor chips;
forming a solder resist on the wiring layer except in portions corresponding to the openings;
forming external electrodes on parts of the wiring layer corresponding to the openings
to form package parts on both surfaces of the support flat plate;
separating the support flat plate from the copper foils of the package parts to obtain two package parts; and
forming an insulating material layer on the copper foils of the two package parts.

* * * * *